United States Patent
Erhart

(10) Patent No.: US 12,015,175 B2
(45) Date of Patent: Jun. 18, 2024

(54) BATTERY SYSTEM WITH FLEXIBLE PRINTED CIRCUIT

(71) Applicant: Samsung SDI Co., Ltd., Yongin-si (KR)

(72) Inventor: Michael Erhart, Seiersberg-Pirka (AT)

(73) Assignee: SAMSUNG SDI CO., LTD., Yongin-si (KR)

(*) Notice: Subject to any disclaimer, the term of this patent is extended or adjusted under 35 U.S.C. 154(b) by 0 days.

(21) Appl. No.: 18/322,388

(22) Filed: May 23, 2023

(65) Prior Publication Data

US 2023/0299429 A1 Sep. 21, 2023

Related U.S. Application Data

(62) Division of application No. 17/137,160, filed on Dec. 29, 2020, now Pat. No. 11,695,189.

(30) Foreign Application Priority Data

Jan. 9, 2020 (EP) .................................. 2015-0865
Dec. 22, 2020 (KR) ....................... 10-2020-0181065

(51) Int. Cl.
*H01M 50/519* (2021.01)
*H01M 10/42* (2006.01)
(Continued)

(52) U.S. Cl.
CPC ..... *H01M 50/519* (2021.01); *H01M 10/4257* (2013.01); *H01M 50/204* (2021.01);
(Continued)

(58) Field of Classification Search
CPC ............. H01M 50/519; H01M 50/528; H01M 50/516; H01M 50/204; H01M 10/4257;
(Continued)

(56) References Cited

U.S. PATENT DOCUMENTS

| 6,423,441 B1 | 7/2002 | Ronning et al. |
| 6,531,662 B1 | 3/2003 | Nakamura |

(Continued)

FOREIGN PATENT DOCUMENTS

| CN | 1348677 A | 5/2002 |
| CN | 1458657 A | 11/2003 |

(Continued)

OTHER PUBLICATIONS

Extended European Search Report issued in corresponding EP Application No. 20150865.2, dated Jul. 16, 2020, 7 pages.

(Continued)

*Primary Examiner* — Jane J Rhee
(74) *Attorney, Agent, or Firm* — Lewis Roca Rothgerber Christie LLP

(57) ABSTRACT

A method for connecting a flexible printed circuit (FPC) to a battery module and a cell supervision circuit board (CSCB) is provided. The method includes: providing a coil of a continuous, strip-shaped FPC; unwinding a first section of the FPC from the coil, positioning the first section of the FPC over a first contact portion of the battery module, and welding a conductive structure of the FPC in the first section to the first contact portion of the battery module; unwinding a second section of the FPC from the coil, positioning the second section of the FPC over a contact pad of the CSCB, and welding the conductive structure of the FPC in the second section to the contact pad of the CSCB; and separating the first section and second section of the FPC from the coil of the FPC.

11 Claims, 5 Drawing Sheets

(51) Int. Cl.
  *H01M 50/204*  (2021.01)
  *H01M 50/516*  (2021.01)
  *H01M 50/528*  (2021.01)
  *H05K 3/32*  (2006.01)
  *H05K 3/36*  (2006.01)

(52) U.S. Cl.
  CPC ....... *H01M 50/516* (2021.01); *H01M 50/528* (2021.01); *H05K 3/328* (2013.01); *H05K 3/361* (2013.01); *H01M 2010/4271* (2013.01); *H05K 2203/107* (2013.01); *H05K 2203/1545* (2013.01)

(58) Field of Classification Search
  CPC .......... H01M 2010/4271; H05K 3/328; H05K 3/361; H05K 2203/107; H05K 2203/1545
  See application file for complete search history.

(56) References Cited

U.S. PATENT DOCUMENTS

| | | | |
|---|---|---|---|
| 9,515,356 | B2 | 12/2016 | Zeng et al. |
| 2003/0235087 | A1 | 12/2003 | Morikawa et al. |
| 2009/0038746 | A1 | 2/2009 | Tucholski |
| 2014/0193680 | A1 | 7/2014 | Lee et al. |
| 2014/0268780 | A1 | 9/2014 | Wang et al. |
| 2015/0214581 | A1 | 7/2015 | Federle et al. |
| 2016/0073506 | A1 | 3/2016 | Coakley et al. |
| 2016/0081193 | A1 | 3/2016 | Leggett et al. |
| 2016/0308256 | A1 | 10/2016 | Huang et al. |
| 2017/0133724 | A1 | 5/2017 | Schuetz |
| 2017/0170526 | A1 | 6/2017 | Wang et al. |
| 2017/0271642 | A1 | 9/2017 | Groshert et al. |
| 2018/0088179 | A1 | 3/2018 | Ota et al. |
| 2018/0090952 | A1 | 3/2018 | Ota et al. |
| 2018/0348305 | A1 | 12/2018 | Schmid-Schoenbein et al. |
| 2019/0074554 | A1 | 3/2019 | Li et al. |
| 2019/0237817 | A1 | 8/2019 | Hammerschmied et al. |
| 2020/0059020 | A1 | 2/2020 | Hammerschmied et al. |

FOREIGN PATENT DOCUMENTS

| | | | |
|---|---|---|---|
| CN | 101572992 | A | 11/2009 |
| CN | 103187552 | A | 7/2013 |
| CN | 103401088 | A | 11/2013 |
| CN | 103766012 | A | 4/2014 |
| CN | 104979595 | A | 10/2015 |
| CN | 106887562 | A | 6/2017 |
| CN | 107871839 | A | 4/2018 |
| CN | 207183332 | U | 4/2018 |
| CN | 109119103 | A | 1/2019 |
| CN | 109891661 | A | 6/2019 |
| EP | 0488580 | A2 | 6/1992 |
| EP | 1458059 | A1 | 9/2004 |
| EP | 2752917 | B1 | 8/2016 |
| EP | 2649701 | B1 | 4/2017 |
| EP | 3316384 | A1 | 5/2018 |
| EP | 3316386 | A1 | 5/2018 |
| EP | 3432409 | A1 | 1/2019 |
| WO | WO 2000/065888 | A1 | 11/2000 |
| WO | WO 2015/101270 | A1 | 7/2015 |
| WO | WO 2015/197319 | A1 | 12/2015 |
| WO | WO 2016/040040 | A1 | 3/2016 |

OTHER PUBLICATIONS

Chinese Notice of Allowance issued in corresponding application No. CN 202110022222.3, dated Apr. 19, 2023, 7 pages.

Chinese Office Action and Search Report dated Nov. 1, 2022 issued in corresponding CN Patent Application No. 202110022222.3 (25 pages).

European Patent Office, Office Action dated Dec. 5, 2022, of the corresponding European Patent Application No. 20150865.2 (5 pages).

BATTERY SYSTEM WITH FLEXIBLE PRINTED CIRCUIT

CROSS-REFERENCE TO RELATED APPLICATION

This application is a divisional of U.S. patent application Ser. No. 17/137,160, filed Dec. 29, 2020, which claims priority to and the benefit of European Patent Application No. 20150865.2, filed in the European Patent Office on Jan. 9, 2020, and Korean Patent Application No. 10-2020-0181065, filed in the Korean Intellectual Property Office on Dec. 22, 2020, the entire content of all of which are incorporated herein by reference.

BACKGROUND

1. Field

Aspects of embodiments of the present disclosure relate to a battery system with a flexible printed circuit.

2. Related Art

A rechargeable (or secondary) battery differs from a primary battery in that it is designed to be repeatedly charged and discharged, while the latter is designed to provide an irreversible conversion of chemical to electrical energy. Low-capacity rechargeable batteries may be used as power supplies for electronic devices, such as cellular phones, notebooks, and camcorders, while high-capacity rechargeable batteries may be used as power supplies for hybrid vehicles or the like.

Generally, rechargeable batteries include an electrode assembly including a positive electrode, a negative electrode, and a separator interposed between the positive and negative electrodes, a case receiving (or accommodating) the electrode assembly, and an electrode terminal electrically connected to the electrode assembly. An electrolyte solution is injected into the case to enable charging and discharging of the battery via an electrochemical reaction between the positive electrode, the negative electrode, and the electrolyte solution. The shape of the case, for example, cylindrical or rectangular, may be selected depending on the battery's intended purpose.

Rechargeable batteries may be used as (e.g., as a part of) a battery module including a plurality of unit battery cells coupled to each other in series and/or in parallel to provide a high energy density for, as an example, motor driving of a hybrid vehicle. For example, the battery module may be formed by interconnecting the electrode terminals of the plurality of unit battery cells to each other, with the number of unit battery cells being selected according to a desired amount of power, to realize a high-power rechargeable battery for, as an example, an electric vehicle.

Battery modules may be constructed either in block design or in modular design. In the block design, each battery cell is coupled to a common current collector structure and a common battery management system. In the modular design, pluralities of battery cells are connected to each other to form submodules, and several submodules are connected to each other to form the battery module. Battery management functions may be realized either on the module or submodule level, and thus, interchangeability of the components is improved. One or more battery modules may be mechanically and electrically integrated, equipped with a thermal management system, and set up to communicate with electrical consumers to form a battery system.

A battery system may include a thermal management system to provide thermal control of the battery system and to safely use the at least one battery module by efficiently emitting, discharging, and/or dissipating heat generated from its rechargeable batteries. If the heat emission/discharge/dissipation is insufficiently performed, temperature deviations may occur between respective battery cells, such that the at least one battery module may no longer generate a desired amount of power. In addition, an increase of the internal temperature can lead to abnormal reactions occurring therein, and thus, charging and discharging performance of the rechargeable batteries deteriorates and the life-span of the rechargeable batteries may be shortened. Thus, cooling devices for effectively emitting/discharging/dissipating heat from the cells are often used.

A static control of battery power output and charging may not be sufficient to meet the dynamic power demands of various electrical consumers connected to the battery system. Thus, steady exchange of information between the battery system and the controllers of the electrical consumers may be employed. This information includes the battery system's actual state of charge (SoC), potential electrical performance, charging ability and internal resistance, as well as actual or predicted power demands or surpluses of the consumers. The battery system usually includes a battery management system (BMS) for processing this information.

The BMS is usually coupled to the controller of one or more electrical consumers as well as to each of the battery modules of the battery system. A daisy chain setup may be used for a single BMS to control a plurality of battery modules. In such a setup, the BMS, as master, is connected for communication in series to a plurality of battery modules, for example, to a plurality of cell supervision circuits (CSC) of the respective battery modules. The BMS is configured to receive and process information of each of the CSCs as well as of external consumer or control units, of (or connected to), for example, a vehicle board net, connected thereto. Further, each of the CSCs is configured to detect voltages and/or temperatures of an individual battery module and to communicate the detected voltages and/or temperatures to the BMS. The CSCs may also be configured for cell balancing within the battery modules.

The CSCs are connected to battery cells or busbars of the respective battery modules to detect cell voltages and/or cell temperatures. These connections between the CSCs and the battery modules can be carried out by using wire bonds. However, the application of wire bonds is a rather slow and cost-intensive process. For example, the flexible printed circuits can be used to establish a connection between a circuit carrier of the CSCs and the battery modules. However, the connection of the flexible printed circuit to the battery module is usually carried out by a manually or semi-automatic process using an additional holding structure. Hence, the use of flexible printed circuit connections is usually cumbersome and also cost-intensive.

SUMMARY

A method of connecting a flexible printed circuit to a battery system, for example, for connecting the battery module and a cell supervision circuit to each other, is provided.

According to an embodiment of the present disclosure, a method for connecting a flexible printed circuit (FPC) to a battery system is provided. The battery system includes one or more battery modules and one or more (e.g., a corresponding number of) cell supervision circuits (CSCs) mounted to one or more cell supervision circuit boards (CSCBs), while generally one CSCB is provided per CSC.

The battery module includes a plurality of aligned (or stacked) battery cells, for example, a plurality of battery cells that are stacked (e.g., arranged adjacent each other) in a lengthwise direction of the battery module. The battery module may include a plurality of stacked prismatic battery cells. Each of the battery cells may include a cell case and a cap assembly on the cell case for closing (e.g., sealing) the cell case. According to an embodiment, the battery cells each include an electrode assembly, a negative cell terminal, and a positive cell terminal, and one of the cell terminals may be formed by (e.g., may be a part of, for example, the cap assembly) or at least connected to the cell case of the battery cell.

The cell supervision circuit (CSC) is mounted to a cell supervision circuit board (CSCB). For example, the CSCB is configured to host a cell supervision circuit (CSC). Herein, the CSC may be (or may include) to a microprocessor, ASIC, or any circuit (e.g., integrated circuit) that is configured to receive signals corresponding to the voltage and/or temperature of at least one battery cell of the battery module. In some embodiments, the CSC is further configured to process, analyze, and/or store the received signals, and the CSC may be configured to transmit signals related to the received signals to another CSC and/or to a battery management system (BMS). Further, the CSC may be configured to perform a control function with respect to the battery module or with respect to the battery cells of the battery module. Herein, the control functions may include measurements or determinations of cell voltages, currents, resistances, or capacities and may further include the active or passive balancing of cell voltages and/or cell currents of the battery cells.

A method according to an embodiment of the present disclosure includes at least the following steps. In a first step, a coil of a continuous and strip-shaped flexible printed circuit (FPC) is provided. The FPC may include a flexible substrate (e.g., a conventional flexible substrate) and may include (or may be made of) polyimide, polyetheretherketone (PEEK), or a transparent conductive polyester film. On or in the flexible substrate, electrically conductive structures (e.g., electrically conductive traces) are provided that can be used for electrically connecting nodes using the FPC. The conductive structures may be planar conductive structures that are formed on an outer or inner surface of the FPC. Further, the conductive structures may be formed by surface metallization's, conductive inks, or the like. The conductive structures may be disposed within the substrate, for example, covered by an insulating substrate layer on both sides of the conductive structure. In such an embodiment, the conductive structures are locally exposed through at least one insulating layer (e.g., through an opening in the at least one insulating layer).

The coil of continuous and strip-shaped FPC may be provided via a coil holder of a tool according to an embodiment of the present disclosure. The coil on the coil holder may store a reservoir of FPC, and the FPC (e.g., a length of the FPC) can be unwound from the coil by, for example, rotating the coil holder such that a section of FPC extends linearly therefrom. The coil holder may be mounted to a tool head of the tool, and the tool head may be configured to perform translational movements in three dimensions.

In a next step, a first section of the FPC is unwound (e.g., unrolled) from the FPC coil holder by, for example, rotating the coil holder. The tool head further includes a guide for guiding the unwound section of the FPC. In an embodiment of the method, the unwound first section of the FPC is positioned over a first contact portion of a battery module of the battery system. The positioning may be performed by using the tool head and/or the guide. In a next step of the method, a weld connection is formed between a conductive structure of the FPC at the first section of the FPC and the first contact portion of the battery module. The weld connection may be performed by the tool head of the tool. For example, a first section of FPC may be automatically unwound from a coil, automatically positioned over a first contact portion of a battery module, and automatically welded to the first contact portion, for example, to a conductive structure of the FPC.

In a next step of the method, a second section of the FPC is unwound from the coil and positioned, again, by rotating the coil holder and, for example, by concurrently (or simultaneously) moving the tool head in a translational manner. The second section of the FPC is then positioned over at least one contact pad of the cell supervision circuit board (CSCB) by the translational movement of the tool head. Then, another weld connection is formed between the conductive structure of the FPC in the second section of the FPC and the contact pad of the CSCB. Again, all the aforementioned steps of the claimed method may be carried out in a fully automatic manner, such as by the tool head.

In a final step of the method, the first section of the FPC and the second section of the FPC are cut from the continuous coil of FPC. For example, a piece of the FPC including at least the first section and the second section is separated (e.g., cut) from the continuous FPC. After the cutting of the first and second sections from the coil, the contact pad of the CSCB and the first contact portion of the battery module are electrically connected via the conductive structure of the FPC that is welded to the first contact portion in the first section and to the contact pad in the second section. Further, after the cutting of the first and second sections from the coil, the steps of the method may be repeated to connect a contact portion (e.g., another contact portion) of a battery module with a contact pad (e.g., another contact pad).

The method according to embodiments of the present disclosure allows for a fully automated and flexible assembly process of the flexible printed circuit in a battery production process. Due to the continuous connection method of the FPC to the various components of the battery module, an additional holder used for mounting the FPC may be omitted. Rather, a continuous FPC coil is assembled and welded in a fully automatic process onto the battery cells, and the FPC may have a simple design of a long. single FPC strip that can be rolled out, welded, and cut automatically. Hence, the method allows for various connection designs of the FPC.

In an embodiment of the present disclosure, the first contact portion of the battery module is a battery cell terminal, a battery cell case, or a busbar. By connecting the FPC in the first section of the FPC to the first contact portion of a battery module, a reliable voltage signal of the battery module may be obtained from the battery module. By tapping the first contact portions of individual battery cells, individual voltage readings may be obtained.

However, in another embodiment, the FPC is connected to a first contact portion and is further connected to a second contact portion of the battery module. For example, after a weld connection is formed between the conductive structure in the first section of the FPC and the first contact portion of the battery module and before the weld connection is formed between the conductive structure in the second section of the FPC and the contact pad of the CSCB, another weld connection is formed between the conductive structure in another (e.g., a third) section of the FPC and the second contact portion of the battery module. Further, the FPC may be connected to a plurality of second contact portions of another or of the same battery module of a battery system via weld connections in other sections of the FPC.

In an embodiment, the first contact portion may be a negative terminal of a battery cell, and a second contact portion may be a positive terminal of another battery cell. In such an embodiment, the CSC is able to receive voltage signals corresponding to the voltage of each of the connected battery cells of the battery module. Hence, voltage signals corresponding to an overall battery module can be obtained. Further, the second contact portion is of another battery module than that of the first contact portion.

In the aforementioned embodiment, the first contact portion and the second contact portion are connected to the conductive structure of the FPC. For example, the first contact portion and the second contact portion are connected, via respective weld connections, to the same conductive structure of the FPC. Hence, a voltage signal corresponding to the overall battery module can be obtained via the conductive structure.

In another embodiment, the FPC includes a first conductive structure and a second conductive structure that is different from the first conductive structure. According to such an embodiment, the first contact portion is connected to the first conductive structure and the second contact portion is connected to the second conductive structure. Hence, voltage signals corresponding to the individual battery cells can be obtained via the first conductive structure and the second conductive structure, respectively. The FPC may include a plurality of conductive structures, such as further conductive structures (e.g., a third conductive structure) that may be connected to further contact portions of the battery module in respective sections (e.g., a third section) along a length extension of the FPC. For example, a single FPC may be used to electrically contact each battery cell of a battery module in an individual manner, for example, via an individual conductive structure. Hence, the FPC may include a conductive structure for each battery cell of a battery module. However, the FPC may also include a conductive structure per a group of cells of a battery module, for example, a cell group that is tapped by one conductive structure.

In another embodiment, the first conductive structure of the FPC is connected to a first CSCB contact pad of a CSCB, and the second conductive structure is connected to a second CSCB contact pad of the same CSCB. For example, the CSCB of this embodiment includes a plurality of contact pads and, after the step of forming the (first) weld connection between the first conductive structure in the second section of the FPC and the first contact pad of the CSCB, another (second) weld connection is formed between the second conductive structure in the second section of the FPC and the second contact pad of the CSCB. Further, in an embodiment in which the FPC includes at least one other (third) conductive structure and the CSCB includes at least one other (third) contact pad, more weld connections can be formed between respective conductive structures and contact pads. Further, an individual contact pad may be provided for each conductive structure. However, contact pads may also be provided for groups of conductive structures of the FPC.

In a method according to an embodiment of the present disclosure, a cell supervision circuit (CSC) is disposed on the CSCB and is connected to the contact pad of the CSCB. For example, the CSCB may include a single CSC contact pad line for connecting an input node of the CSC to a single contact pad or even to a plurality of contact pads for sequential measurements. Also, the CSCB may include a plurality of contact pad lines for connecting a plurality of input nodes of the CSC to respective individual contact pads for concurrent (or simultaneous) measurements. The CSC may further include communication pads that are connected to the CSC, for example, to communication nodes thereof, via respective CSC communication lines formed as conductive structures on the CSCB. The CSC communication line may be separate from the CSC contact pad line. The communication lines and the communication nodes of a CSC may be connected to other CSCs on other CSCBs or to a BMS in, for example, a daisy chain setup via the communication pads.

Another embodiment of the present disclosure relates to a tool for connecting a flexible printed circuit (FPC) to a battery module by using a method according to an embodiment of the present disclosure as described above. Therefore, the tool includes a tool head that may be one of a plurality of tool heads. However, the tool may also include the tool head and a mount for the tool head. According to an embodiment of the present disclosure, the tool head includes a coil holder that is configured to receive a coil of a continuous and strip-shaped FPC. The coil holder may be rotatable such that a section of the continuous coil of FPC can be unwound from the coil by the rotation of the coil holder. The tool further comprises a guide that is configured to receive a section of the unwound FPC and for guiding the section of unwound FPC into an area that is parallel to a contact portion of a battery module.

The tool head may be further configured to perform a translational movement in an area that is parallel to a contact portion of a battery module and that is also parallel to a contact pad of a CSCB, for example, in an x-direction and in a y-direction. Further, the tool head is configured to perform a translational movement in a direction parallel to normal vectors of the contact portion(s) of the battery module and of the CSCB contact pad. The tool head may be moved by a rack and pinion drive system, a linear motor, or the like. However, the present disclosure is not limited thereto, and a skilled person is aware of systems for providing three-dimensional movement of a tool head.

The tool head, according to an embodiment of the present disclosure, further includes an optical sensor for detecting a position of the unwound (or unrolled) FPC. The tool head may also include a plurality of optical sensors for detecting a position of the unwound FPC in different dimensions. For example, the section of the FPC may be unrolled from the coil of the FPC in a direction parallel to a normal vector of a contact portion and is then deflected by the guide into an area parallel to the contact portion. The tool head includes an optical sensor for detecting the position (e.g., the length) of the unwound FPC in the direction parallel to the normal vector. For example, the first optical sensor is used to detect a length of an unwound FPC section. Further, the tool head may include another optical sensor, which may be a camera, for detecting a position of the unwound FPC with respect to the contact portion of the battery module or with respect to the CSCB contact pad. The optical sensor may be configured to detect the position of the FPC relative to an alignment indicator.

The tool head, according to an embodiment of the present disclosure, further includes a welder for providing a weld connection between a conductive structure of the FPC with the contact portion and with the CSCB contact pad. As described above, the FPC includes a conductive structure that is either formed on or in the FPC. The weld connection may be made by locally liquefying the conductive structure to form a mechanical stable and electrically conductive weld connection with the contact portion of the battery module or with the contact pad of the CSCB. The welder may be (or may include) an arc welder, a gas welder, or an energy beam welder. For example, the welder may be (or may include) a laser that is configured to make a laser weld connection between the FPC and the contact portion and the CSCB contact pad.

Further, the tool head of the tool, according to an embodiment of the present disclosure, is configured to perform a rotational movement about an axis that is parallel to the normal direction of the contact portion of the battery module and the contact pad of the CSCB. By using the tool head, the FPC can also be connected to the battery module in a curved configuration according to a method of the present disclosure. This allows for more complex configurations, for example, by connecting an FPC to several battery modules and to a CSCB. Such configurations are possible due to the flexibility of the FPC.

Further, the tool head of the tool, according to an embodiment of the present disclosure, includes a cutter for separating (e.g., cutting) the FPC after making a weld connection between the conductive structure and the CSCB contact pad. As described above, the tool head includes a guide for guiding an unwound section of the FPC onto the contact portion of the battery module or the contact pad of the CSCB. The cutter interacts with the FPC while it is guided by the guide and separates an unwound section of the FPC from the continuous portion of FPC on the coil. The cutter includes a cutting edge mounted to the tool head and is movable in a z-direction. However, the cutter may be laser or a saw for separating the FPC.

Another embodiment of the present disclosure is directed to a battery system including a plurality of battery modules, and a contact portion of each battery module is connected to a contact pad of a cell supervision circuit board (CSCB) via a respective flexible printed circuit (FPC) by using a method according to the present disclosure as described above. For example, the FPC is connected to the battery module and to the contact pad by performing the method according to an embodiment of the present disclosure as described above. Further, the FPC may be connected to the contact portions of the battery modules and to the contact pads of the CSCBs via a tool head of a tool according to an embodiment of the present disclosure as described above. Thus, the FPC is connected to the contact portions of the battery module and the CSCB contact pad via weld connections.

For example, the FPC has a curved section between adjacent weld connections. Hence, the FPC does not connect the weld connections along a shortest distance there between (e.g., within a plane formed by the x- and y-directions), but the FPC also extends in a direction normal to the contact portion and contact pad between them. For example, the curved section of the FPC between two weld pads is curved in a height direction of the battery module. Hence, a material reservoir of the FPC is formed between the weld connections, and such a material reservoir allows the FPC to compensate for cell swelling or otherwise-caused spatial displacements of the battery cells forming the battery module. Hence, the FPC provides sufficient electric contact between the CSC and the battery cells even when cell swelling or spatial displacement of battery cells occurs.

In a battery system according to an embodiment of the present disclosure, the battery modules communicate with a BMS and/or with each other. Further, the battery system includes a plurality of battery modules (e.g., a plurality of identical battery modules), each including the same number of battery cells that are stacked in the same way. Further, the battery system includes a plurality of identical cell supervision circuit carriers, each being connected to at least one of the battery modules via at least one FPC. Therein, each cell supervision carrier (CSC) is (or includes) a microprocessor, ASIC, or any suitable circuit (e.g., an integrated circuit) that is configured to receive signals corresponding to the voltage and/or temperature of the respective battery module.

The CSC is further configured to process, analyze, and/or store the received signals, and the CSC may be configured to transmit signals related to the received signals to another CSC and/or to a BMS. Further, the CSC may be configured to perform a control function with respect to the battery module or with respect to at least one of the battery cells thereof. The control functions may include measurements or determinations of cell voltages, cell currents, cell resistances, or cell capacities and may further include the active or passive balancing of cell voltages or cell currents of battery cells in the battery module. For example, the CSCC may include (or may be formed of) a flexible circuit board (FPC), for example, a flexible substrate as commonly used for flexible printed circuits, such as, polyimide, polyetheretherketone (PEEK), or a transparent conductive polyester film. Any conductive surface structures as described above, for example, conductive lines, may be printed onto the substrate.

In a battery system according to an embodiment of the present disclosure, a first FPC is connected to a first battery module and a contact pad of a first CSCB and a second FPC is connected to a second battery module and a contact pad of a second CSCB. For example, in this embodiment, individual FPCs are provided for connecting the battery modules and the respective CSCBs to each other. For example, the FPCs extend linearly between the battery module and the corresponding CSCB. This embodiment allows for the use of simple designs of FPC and tool head.

According to another embodiment of the battery system, an FPC is connected to a plurality of battery modules and a contact pad of a CSCB. For example, according to this embodiment, one CSC is connected to a plurality of battery modules. In this embodiment, the FPC has a curved section. For example, the FPC has a U-shape, an S-shape, or another shape that has a curved section. In this embodiment, the FPC is connected to the battery modules with a tool head that is configured to rotate about an axis that is parallel to a normal vector of the contact portion.

In another embodiment of the battery system, the battery system includes a first CSCB that has a first communication pad and a second CSCB that has a second communication pad. The first and second communication pads are interconnected via a flexible printed circuit (FPC) in a method according to an embodiment of the present disclosure as described above. For example, each of the CSCBs includes a first communication pad and a second communication pad. According to this embodiment, the CSCs are connected to each other and also to a BMS via an FPC. Further, the CSCs and the BMS may be connected to each other in a daisy chain arrangement. A battery system with a plurality of connectable CSCBs can be set up for daisy chain communication with a BMS. In some embodiments, the cell supervision circuits (CSCs) are configured to transmit and receive digital or analogous signals (e.g., differential signals) via the FPCs and/or via communication pads connecting the CSCs to each other and/or to a BMS.

The cell supervision circuit boards (CSCBs) of the battery system may be configured to host a cell supervision circuit (CSC) or host a respective CSC. Herein, a CSC may include (or may be) a microprocessor, ASIC, or any suitable (integrated) circuit that is configured to receive signals corresponding to the voltage and/or temperature of at least one battery cell of the battery module. The CSC is further configured to process, analyze, and/or store the received signals, and the CSC may be configured to transmit signals related to the received signals to another CSC and/or to a BMS. Further, the CSC may be configured to perform a control function with respect to the battery module or with respect to at least one battery cells thereof. The control functions may include measurements or determinations of cell voltages, cell currents, cell resistances, or cell capacities and may further include the active or passive balancing of cell voltages or cell currents of cells.

For example, each CSCB includes (or is) a substrate that is configured for receiving (or accommodating) the CSC thereon or therein by, for example, providing a suitable chip socket, landing pads, or wire frame for a CSC or that is at least configured to be connected to the CSC. The CSCB further includes communication lines and contact pad lines that are configured for establishing data communication with the CSC. The communication lines may establish a data communication between the CSC received on or in the CSCB and another CSC, a BMS, and/or an external control unit (e.g., a control unit of an external consumer). Further, the contact pad lines are configured for reading in signals received by CSCB contact pads.

Further aspects and features of the present disclosure are disclosed in the appended drawing and in the following description thereof.

BRIEF DESCRIPTION OF THE DRAWINGS

Aspects and features of the present disclosure will become apparent to those of ordinary skill in the art by describing, in detail, exemplary embodiments thereof with reference to the attached drawings in which.

DETAILED DESCRIPTION

Figure 1:
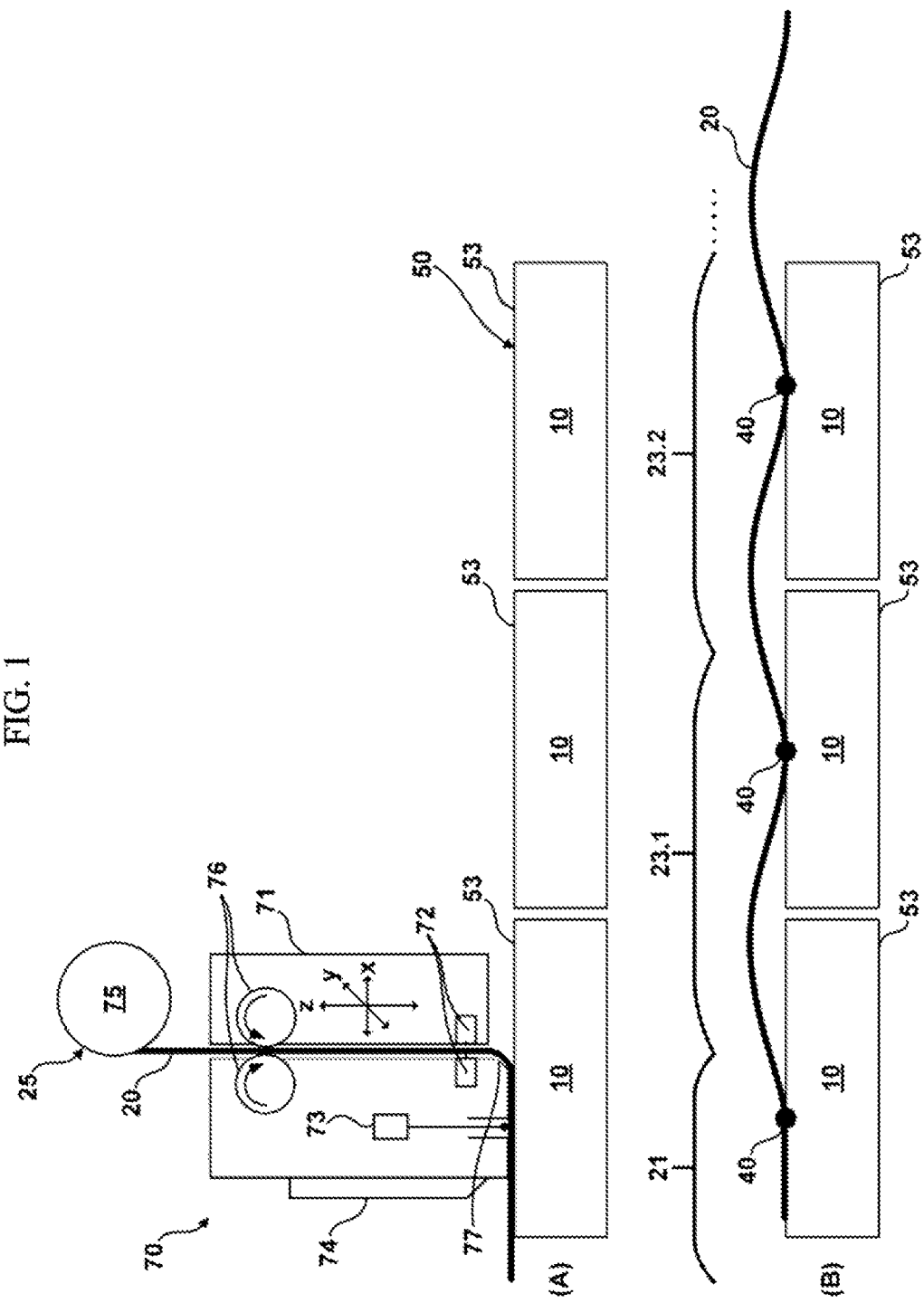
FIG. 1 schematically illustrates a method for connecting a flexible printed circuit (FPC) to a battery cell of a battery module according to an embodiment.

Reference will now be made in detail to embodiments, examples of which are illustrated in the accompanying drawings. Aspects and features of the present disclosure, and implementation methods thereof, will be described with reference to the example embodiments shown in the accompanying drawings. The present disclosure, however, may be embodied in various different forms and should not be construed as being limited to the embodiments illustrated herein. Rather, these embodiments are provided as examples so that this disclosure will be thorough and complete, and will fully convey the aspects and features of the present disclosure to those skilled in the art. Processes, elements, and techniques not considered necessary for those having ordinary skill in the art to have a complete understanding of the aspects and features of the present disclosure may be omitted.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure refers to "one or more embodiments of the present disclosure." In the following description of embodiments of the present disclosure, the terms of a singular form may include plural forms unless the context clearly indicates otherwise. Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

It will be understood that although the terms "first" and "second" are used to describe various elements, these elements should not be limited by these terms. These terms are only used to distinguish one element from another element. For example, a first element may be named a second element and, similarly, a second element may be named a first element, without departing from the scope of the present disclosure. As used herein, the term "substantially," "about," and similar terms are used as terms of approximation and not as terms of degree, and are intended to account for the inherent deviations in measured or calculated values that would be recognized by those of ordinary skill in the art. Further, if the term "substantially" is used in combination with a feature that could be expressed using a numeric value, the term "substantially" denotes a range of +/−5% of the value centered on the value.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

FIG. 1 schematically illustrates a method for connecting a flexible printed circuit (FPC) 20 to a plurality of battery cells 10 of a battery module 50 according to an embodiment. Therein, FIG. 1 (A) illustrates operation of a tool 70, including a tool head 71, in the method.

A coil 25 of continuous FPC 20 is provided in the tool head 71 of the tool 70. The tool head 71 shown in FIG. 1 is configured to move in all three dimensions in a translational manner as indicated by the arrows. As indicated in FIG. 1, sections of FPC 20 can be unwound from the coil 25 of FPC 20 via two feed rolls (e.g., feed rollers) 76. A section of FPC 20 drawn from the coil 25 initially extends vertically downward in the z-direction within the tool head 71 of the tool 70. The section of FPC 20 is then deflected by a rounded guide 77 of the tool head 71 such that it extends across an area that is parallel to an area of the contact portions (e.g., top surfaces) of the battery cells 10. The deflection of the FPC 20 is provided by the guide 77 and the movement of the tool head 71 in the positive x-direction in the illustration. Further, as the FPC 20 is unwound from the coil 25, a position of the FPC 20 is detected via an optical sensor 72 by, for example, detecting (or counting) a number of indicators periodically (e.g., regularly) positioned on the FPC 20 having passed by the optical sensor 72.

Figure 5:
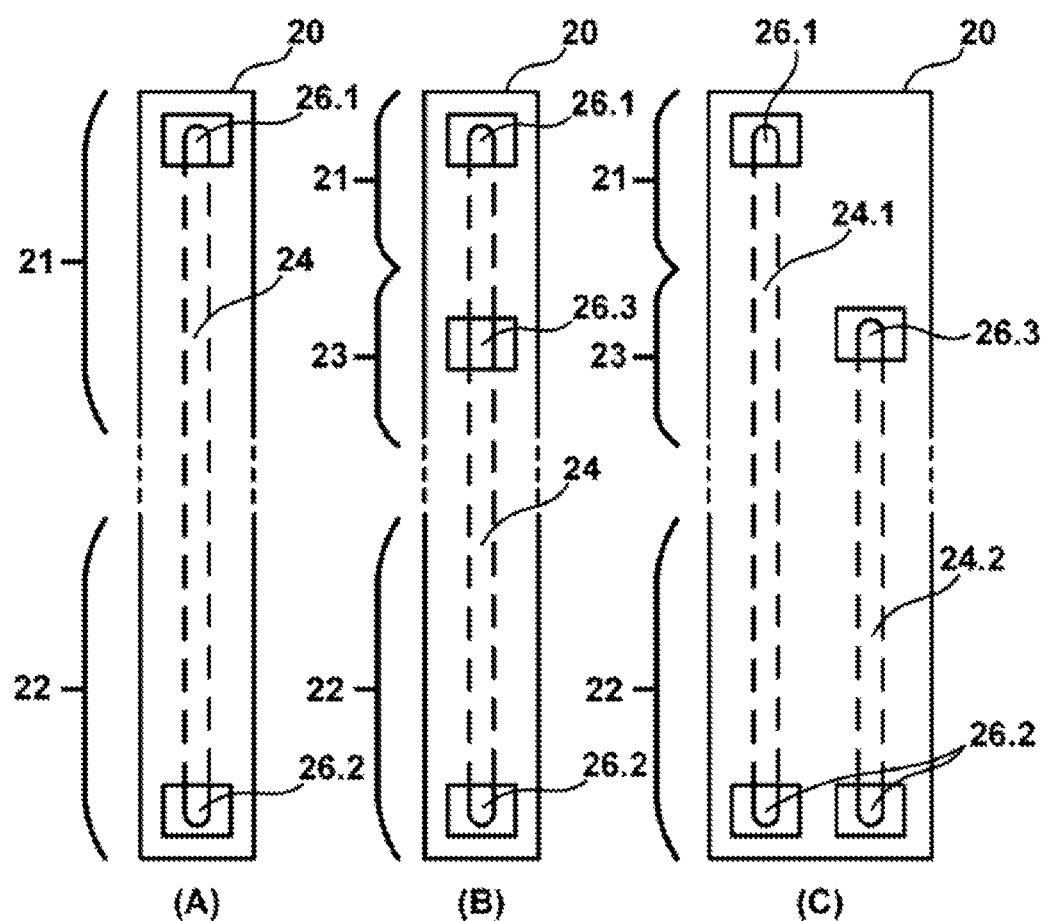
FIG. 5 schematically illustrates various flexible printed circuits (FPCs) according to embodiments.

The tool head 71 further includes a laser 73 for welding a first section 21 of the FPC 20 that extends parallel to an upper surface of one of the battery cells 10 to the upper surface of the corresponding battery cell 10, for example, to an upper surface of a battery cell case 53 of the battery cell 10. In some embodiments, a conductive structure (e.g., conductive elements or traces) of the FPC 20, described in more detail below with respect to FIG. 5, is welded to the battery cell 10 by the laser 73. Hence, a weld connection 40 between the first section 21 of the FPC 20 and the battery cell 10 is formed as illustrated in FIG. 1(B). As further illustrated in FIG. 1(B), additional weld connections 40 are formed between other (e.g., second, third, etc.) sections 23.1, 23.2 of the FPC 20 and other ones (e.g., second, third, etc.) of the battery cells 10 by repeating the operations of the tool head 71 as described above with respect to FIG. 1 (A). Between the weld connections 40, the tool head 71 not only performs translational movement in, for example, the x-direction but also performs curved movement in, for example, the z-direction to form a curved section of FPC 20 between the weld connections 40 to different battery cells 10 (or battery cell cases 53). Further, the operations of the tool head 71 are also repeated to provide a weld connection between a contact pad of a cell supervision circuit board (CSCB) in a similar manner.

The tool head 71 of the tool 70 according to the illustrated embodiment includes a cutting device 74 for cutting the FPC 20 after making a weld connection between a conductive structure and a contact pad of the CSCB. As described above, the tool head 71 includes a guide 77 for guiding an unwound section of the FPC 20 onto a contact portion of the battery module 50 or the contact pad of the CSCB. The cutting device 74 may interact with the FPC 20 while it is guided by the guide 77 and separates an unwound section of the FPC 20 from the continuous portion of FPC 20 on the coil 25. The cutting device 74 may include a cutting edge mounted to the tool head 71 and may be movable in, for example, the z-direction. However, the cutting device 74 may be a laser or a saw.

Figure 2:
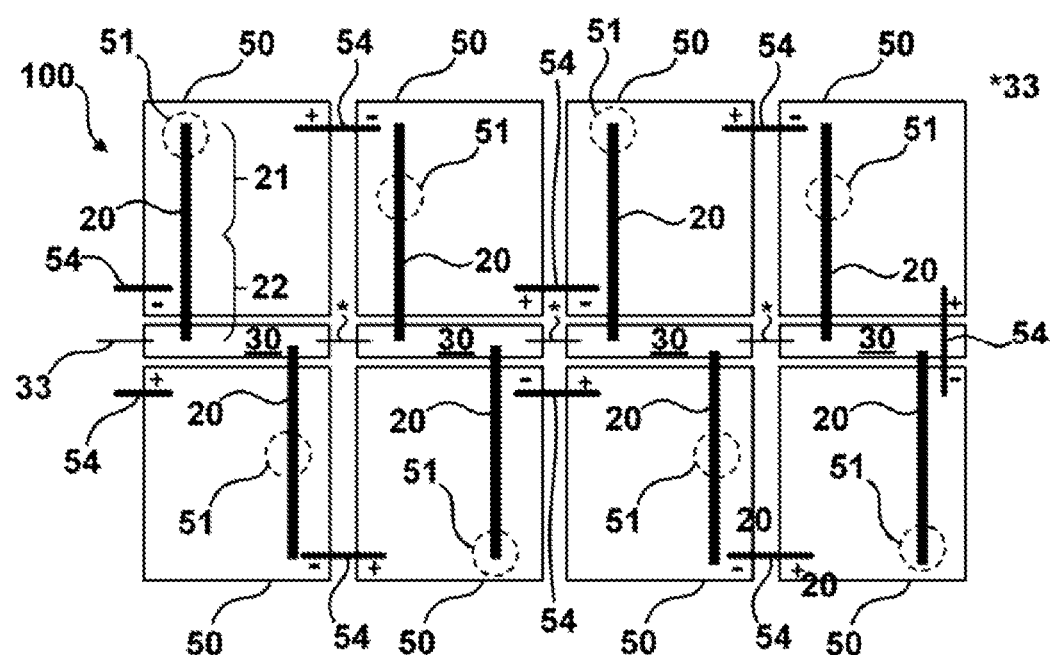
FIG. 2 illustrates a schematic top view of a battery system according to an embodiment.

FIG. 2 illustrates a schematic top view of a battery system 100 according to an embodiment produced by the method schematically illustrated in FIG. 1. The battery system 100 includes a plurality of (e.g., eight) battery modules 50, each of which includes a plurality of stacked (or aligned) battery cells 10. The battery modules 50 are interconnected by busbars 54 that connect a positive terminal of one battery module 50 to a negative terminal of another (e.g., an adjacent) battery module 50. Further, ones of the busbars 54 provide electric contact to a positive and a negative system terminal. In FIG. 2, the eight battery modules 50 are arranged in two rows of four battery modules 50 with a row of four cell supervision circuit boards (CSCBs) 30 arranged between a battery module 50 in the first row and a corresponding battery module 50 in the second row. Each of the CSCBs includes a cell supervision circuit (CSC). Further, each of the battery modules 50 is connected to a corresponding CSCB via an FPC 20. The FPCs 20 are connected to the battery modules 50 by, for example, the method described above, that is, by automatically forming a weld connection between a conductive structure of an FPC 20 in a first section 21 of the FPC 20 and a contact portion 51 of a battery module 50. Further, the FPCs 20 are connected to the CSCBs 30 by, for example, the method described above, that is, by automatically forming a weld connection between a conductive structure of an FPC 20 in a section 22 of the FPC 20 and a contact pad of the CSCB 30. For example, a plurality of (e.g., two) battery modules 50 are connected to each CSCB 30 via a corresponding plurality (e.g., two) FPCs 20, for example, via one linearly extending FPC 20 per battery module 50. As illustrated in FIG. 2, the first contact portions 51 of the battery modules 50 may be positioned differently in the first section 21 of the respective linearly extending stripe of FPC 20. As illustrated in FIG. 2, adjacent CSCBs 30 are connected via FPC connectors 33.

Figure 3:
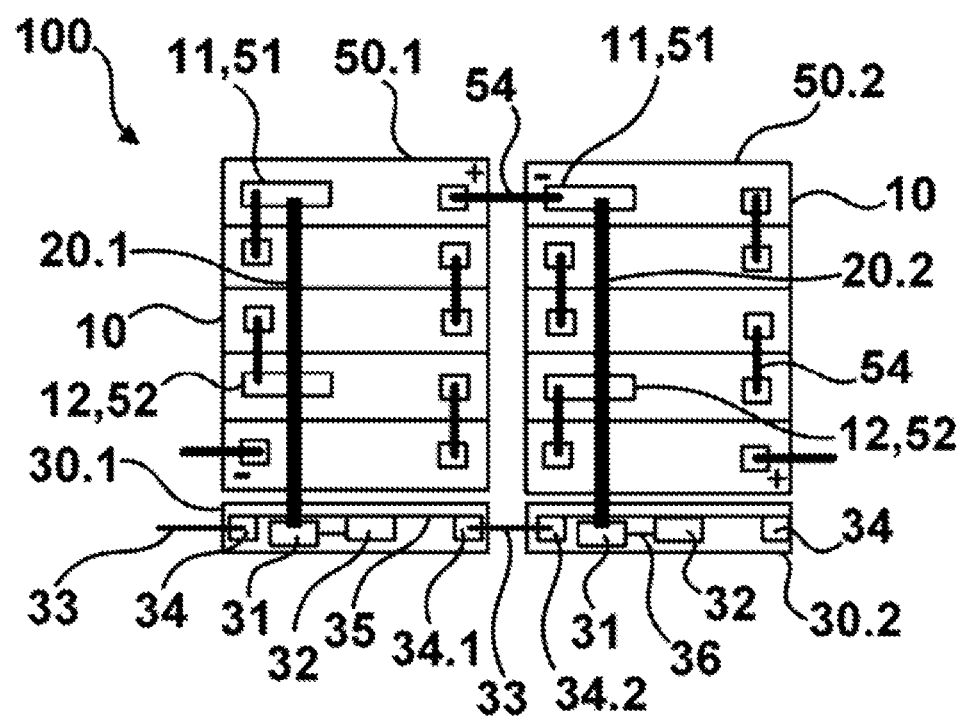
FIG. 3 illustrates a more detailed top view of the battery system shown in FIG. 2.

FIG. 3 illustrates a more detailed top view of the battery system 100 shown in FIG. 2. In more detail, FIG. 3 is a more detailed top view of a section (or portion) of the battery system 100 shown in FIG. 2 with a first battery module 50.1 and a second battery module 50.2 from the first (or upper) row of the battery modules 50 as shown in FIG. 2. A first CSCB 30.1 is arranged below the first battery module 50.1, and a second CSCB 30.2 is arranged below the second battery module 50.2. As illustrated in FIG. 3, and in an exemplary manner, each of the battery modules 50 includes five prismatic battery cells 10 that are stacked with respect to each other in an aligned manner. The battery modules 50 may include more battery cells, such as eight or twelve battery cells 10. Each of the battery cells 10 includes a negative terminal 11 and a positive terminal 12 disposed on a top surface of the battery cell 10. Further, a positive terminal 12 of a battery cell 10 is connected to a negative terminal 11 of an adjacent battery cell 10 via a busbar 54, and a positive terminal 12 of one battery cell 10 of the first battery module 50.1 is connected to a negative terminal 11 of one battery cell 10 of the adjacent second battery module 50.2.

Further, the first battery module 50.1 is connected to a contact pad 31 of the first CSCB 20.1 via a first FPC 20.1, and the second battery module 50.2 is connected to a contact pad 31 of the second CSCB 20.2 via a second FPC 20.2. Therein, each of the FPCs 20.1, 20.2 is connected to the respective battery module 50.1, 50.2 at a contact portion. In some embodiments, a first contact portion 51 of the battery modules 50.1, 50.2 is a negative terminal 11 that extends laterally to provide an additional (or enlarged) contact area for a corresponding FPC 20.1, 20.2. Further, the second contact portion 52 of the battery modules 50.1, 50.2 may be a positive terminal 12 that extends laterally to provide an additional (or enlarged) contact area for a corresponding FPC 20.1, 20.2. For example, a weld connection is formed between the FPCs 20.1, 20.2 and the first and second contact portions 51, 52 of the first and second battery module 50.1, 50.2.

Weld connections are also formed between the first and second FPCs 20.1, 20.2 and the contact pads 31 of the first and second CSCB 30.1, 30.2, respectively. The weld connections are formed in sections of the FPCs 20.1, 20.2, respectively. Further, the contact pads 31 of the CSCBs 30.1, 30.2 are connected to respective cell supervision circuits (CSCs) 32 of the respective CSCB 30 via a respective CSC communication line 35. For example, a voltage signal from the battery modules 50.1, 50.2 received via the respective contact pad 31 is forwarded to the respective CSC 32 via a respective CSC contact pad line 36. Further, each of the CSCBs 30 includes CSCB communication pads 34 that are connected to the respective CSC 32 via respective CSC communication lines 35. Further, a first CSC communication pad 34.1 of the first CSCB 30.1 is connected to a second CSC communication pad 34.2 of the second CSCB 30.2 via an FPC connector 33. Further, the FPC connectors 33 are provided to connect adjacent CSCBs 30 to each other by, for example, forming a daisy chain connection between the CSCBs 30.

Figure 4:
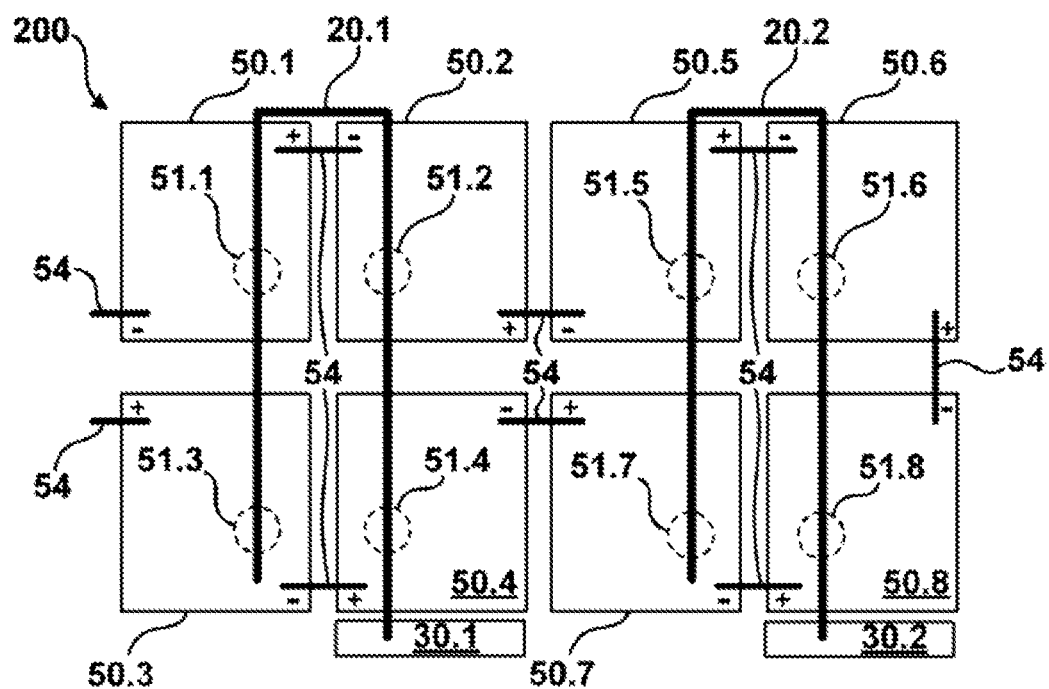
FIG. 4 illustrates a schematic top view of a battery system according to an embodiment.

FIG. 4 illustrates a schematic top view of a battery system 200 according to an embodiment. The battery system 200 shown in FIG. 4 is similar to the battery system 100 shown in FIG. 2, and the same components are denoted by same reference numerals and a repeated description thereof may be omitted. In the embodiment shown in FIG. 4, the battery modules 50 are not connected to CSCBs 30 in an individual manner but rather groups of battery modules are connected to a CSCB via a common FPC. For example, a first group of four battery modules 50.1, 50.2, 50.3, 50.4 is connected to a first CSCB 30.1 via a first FPC 20.1, and a second group of four battery modules 50.5, 50.6, 50.7, 50.8 is connected to a second CSCB 30.2 via a second FPC 20.2. Each of the first and second FPC 20.1, 20.2 has an essential (or substantially) U-shaped configuration with the opening in the U-shape facing downward in the figure (e.g., facing toward the corresponding FPC 20).

The first FPC 20.1 is connected to a first contact portion 51.1 of the first battery module 50.1, to a first contact portion 51.2 of the second battery module 50.2, to a first contact portion 51.3 of the third battery module 50.3, to a first contact portion 51.2 of the fourth battery module 50.4, and to a contact pad of the first CSCB 30.1. Further, the second FPC 20.2 is connected to a first contact portion 51.5 of the fifth battery module 50.5, to a first contact portion 51.6 of the sixth battery module 50.6, to a first contact portion 51.7 of the seventh battery module 50.7, to a first contact portion 51.8 of the eighth battery module 50.8, and to a contact pad of the second CSCB 30.2. Therein, the contact portions may be configured as described with respect to FIGS. 1-3. However, the contact portions may also be formed by battery cell cases 53 of cells 10 or by busbars 54 of the battery modules 50.

FIG. 5 schematically illustrates flexible printed circuits 20 according to embodiments of the present disclosure. FIG. 5(A) illustrates an FPC 20 according to an embodiment having a conductive structure 24 embedded between two flexible insulating layers, with the dashed lines indicating the conductive structure 24. The conductive structure 24 extends from a first section 21 of the FPC 20 to a second section 22 of the FPC 20. A first contact area 26.1 of the FPC 20 is exposed by an opening in the first section 21, and a second contact area 26.2 of the FPC 20 is exposed by an opening in the second section 22. For example, openings in an upper insulating layer expose the contact areas 26.1, 26.2 of the conductive structure 24 in the first and second sections 21, 22. The openings in the first and second sections 21, 22 are either preformed in the insulating layers or are formed during the welding process of the conductive structure 24.

FIG. 5(B) illustrates an FPC 20 according to an embodiment that differs from the embodiment of the FPC 20 shown in FIG. 5(A) in it further include a third contact area 26.3 of the conductive structure 24 exposed by an opening in another (e.g., a third) section 23. The first and third contact areas 26.1, 26.3 are configured for contacting contact portions of a battery module, and the second contact area 26.2 is configured for contacting a CSCB contact pad. The FPC 20 as shown in FIG. 5(B) allows for a voltage signal of two battery cells 10 to be obtained.

FIG. 5(C) illustrates an FPC 20 according to an embodiment that differs from the embodiments of the FPCs 20 shown in FIGS. 5(A) and 5(B) in that it includes a first conductive structure 24.1 and a second conductive structure 24.2. The first conductive structure 24.1 includes a first contact area 26.1 that is exposed by an opening in the first section 21 and a second contact area 26.2 that is exposed by an opening in the second section 22. Further, the second conductive structure 24.2 includes a third contact area 26.3 of the conductive structure 24 that is exposed by an opening in another (e.g., the third) section 23 and a second contact area 26.2 that is exposed by an opening in the second section 22. The FPC 20 as shown in FIG. 5(C) allows for two voltage signals of two cells 10 to be obtained.

REFERENCE SIGNS 10 battery cell
11 negative terminal
12 positive terminal
20 flexible printed circuit, FPC
21 FPC first section
22 FPC second section
23 FPC further (third) section
24 FPC conductive structure 25 FPC coil
26 FPC contact area
30 cell supervision circuit board, CSCB
31 CSCB contact pad
32 cell supervision circuit, CSC
33 FPC connector
34 CSCB communication pad
35 CSC communication line
36 CSC contact pad line
40 weld connection
50 battery module
51 first contact portion
52 second contact portion
53 battery cell case
54 busbar
70 FPC connecting tool
71 tool head
72 optical sensor
73 (laser) welding means
74 cutting means
75 coil holder
100 battery system

What is claimed is:

1. A method for connecting a flexible printed circuit (FPC) to a battery module and a cell supervision circuit board (CSCB), the method comprising:
providing a coil of a continuous, strip-shaped FPC;
unwinding a first section of the FPC from the coil, positioning the first section of the FPC over a first contact portion of the battery module, and welding a conductive structure of the FPC in the first section to the first contact portion of the battery module;
unwinding a second section of the FPC from the coil, positioning the second section of the FPC over a contact pad of the CSCB, and welding the conductive structure of the FPC in the second section to the contact pad of the CSCB; and
separating the first section and second section of the FPC from the coil of the FPC.

2. The method according to claim 1, wherein the first contact portion of the battery module is a battery cell terminal, a battery cell case, or a busbar.

3. The method according to claim 1, wherein the FPC is connected to a second contact portion of the battery module, and wherein the first contact portion is a negative terminal of a battery cell, and the second contact portion is positive terminal of another battery cell.

4. The method according to claim 3, wherein the first contact portion and the second contact portion are connected to the conductive structure of the FPC.

5. The method according to claim 3, wherein the FPC comprises a first conductive structure and a second conductive structure, and
wherein the first contact portion is connected to the first conductive structure, and the second contact portion is connected to the second conductive structure.

6. The method according to claim 5, wherein the first conductive structure is connected to a first CSCB contact pad, and the second conductive structure is connected to a second CSCB contact pad.

7. The method according to claim 1, wherein a cell supervision circuit (CSC) is disposed on the CSCB and is connected to the contact pad of the CSCB.

8. A battery system comprising a plurality of the battery modules and a plurality of the CSCBs,
wherein the first contact portion of each of the battery modules is connected to the contact pad of one of the CSCBs via one of the FPCs by using the method according to claim 1.

9. The battery system according to claim 8, wherein a first one of the FPCs is connected to a first one of the battery modules and a contact pad of a first one of the CSCBs, and a second one of the FPCs is connected to a second one of the battery modules and a contact pad of a second one of the CSCBs.

10. The battery system according to claim 8, wherein one of the FPCs is connected to a plurality of the battery modules and a contact pad of one of the CSCBs, and
wherein the one of the FPCs has a curved section.

11. The battery system according to claim 8, wherein the plurality of the CSCBs comprises a first CSCB comprising a first communication pad and a second CSCB comprising a second communication pad, and
wherein the first and second communication pads are interconnected via an FPC connector by using the method according to claim 1.

* * * * *